United States Patent [19]

Puar

[11] Patent Number: 4,786,956
[45] Date of Patent: Nov. 22, 1988

[54] INPUT PROTECTION DEVICE FOR INTEGRATED CIRCUITS

[75] Inventor: Deepraj S. Puar, Sunnyvale, Calif.

[73] Assignee: North American Philips Corporation, Signetics Division, Sunnyvale, Calif.

[21] Appl. No.: 786,899

[22] Filed: Oct. 11, 1985

Related U.S. Application Data

[63] Continuation of Ser. No. 435,586, Oct. 20, 1982, abandoned.

[51] Int. Cl.$^4$ .................. H01L 29/78; H01L 27/04
[52] U.S. Cl. .................. 357/23.13; 357/23.11; 357/23.12
[58] Field of Search .............. 357/23.6, 23.7, 23.13, 357/41; 361/91

[56] References Cited

U.S. PATENT DOCUMENTS

| | | | |
|---|---|---|---|
| 3,777,216 | 12/1973 | Armstrong | 357/41 |
| 3,881,180 | 4/1975 | Gosney, Jr. | 357/13 |
| 3,967,295 | 6/1976 | Stewart | 357/23 GP |
| 4,035,820 | 7/1977 | Matzen | 357/13 |
| 4,115,709 | 9/1978 | Inoue et al. | 357/23 GP |
| 4,288,829 | 9/1981 | Tango | 357/23 TF |
| 4,342,045 | 7/1982 | Kim | 357/23.13 |
| 4,384,218 | 5/1983 | Shimotori et al. | 357/23.6 |
| 4,423,431 | 12/1983 | Sasaki | 357/23.13 |
| 4,602,267 | 7/1986 | Shirato | 357/23.13 |

FOREIGN PATENT DOCUMENTS

| | | |
|---|---|---|
| 32018 | 7/1981 | European Pat. Off. . |
| 42305 | 12/1981 | European Pat. Off. . |
| 55552 | 7/1982 | European Pat. Off. . |
| 55-166953 | 12/1980 | Japan . |
| 57-162468 | 10/1982 | Japan . |

OTHER PUBLICATIONS

T. Hulett, "On Chip Protection of High Density NMOS Devices", 1981, *Electrical Overstress/Electrostatic Discharge Symposium*, 22–24, Sep. 1981, Las Vegas, published in 1981, *EOS/ESD Proceesings*, pp. 90–96.

R. Taylor, "Input Protection Design for the 3u NMOS Process", 1981, *Electrical Overstress/Electrostatic Discharge Symposium*, 22–24, Sep. 1981, Las Vegas, Presumably Published in 1981, EOS/ESD Proceedings.

T. Turner et al., "Electrostatic Sensitivity of Various Input Protection Networks", *Proceedings of the 1980 Electrical Overstress/Electrostatic Discharge Symposium*, pp. 95–103.

J. Keller, "Protection of MOS Integrated Circuits from Destruction by Electrostatic Discharge", *Proceedings of the 1980 Electrical Overstress/Electrostatic Discharge Symposium*, pp. 73–80.

*Primary Examiner*—William D. Larkins
*Attorney, Agent, or Firm*—R. Meetin; D. Treacy; T. Briody

[57] ABSTRACT

A device (16) for preventing an input signal ($V_I$) applied to a terminal (12) of an integrated circuit from damaging a section (18) of the circuit contains a regular enhancement-mode insulated-gate FET (Q1 or Q2), a resistor (R1 or R2) that enables the regular FET to act temporarily like a "floating-gate" FET, and a thick-oxide insulated-gate FET (Q3).

16 Claims, 4 Drawing Sheets

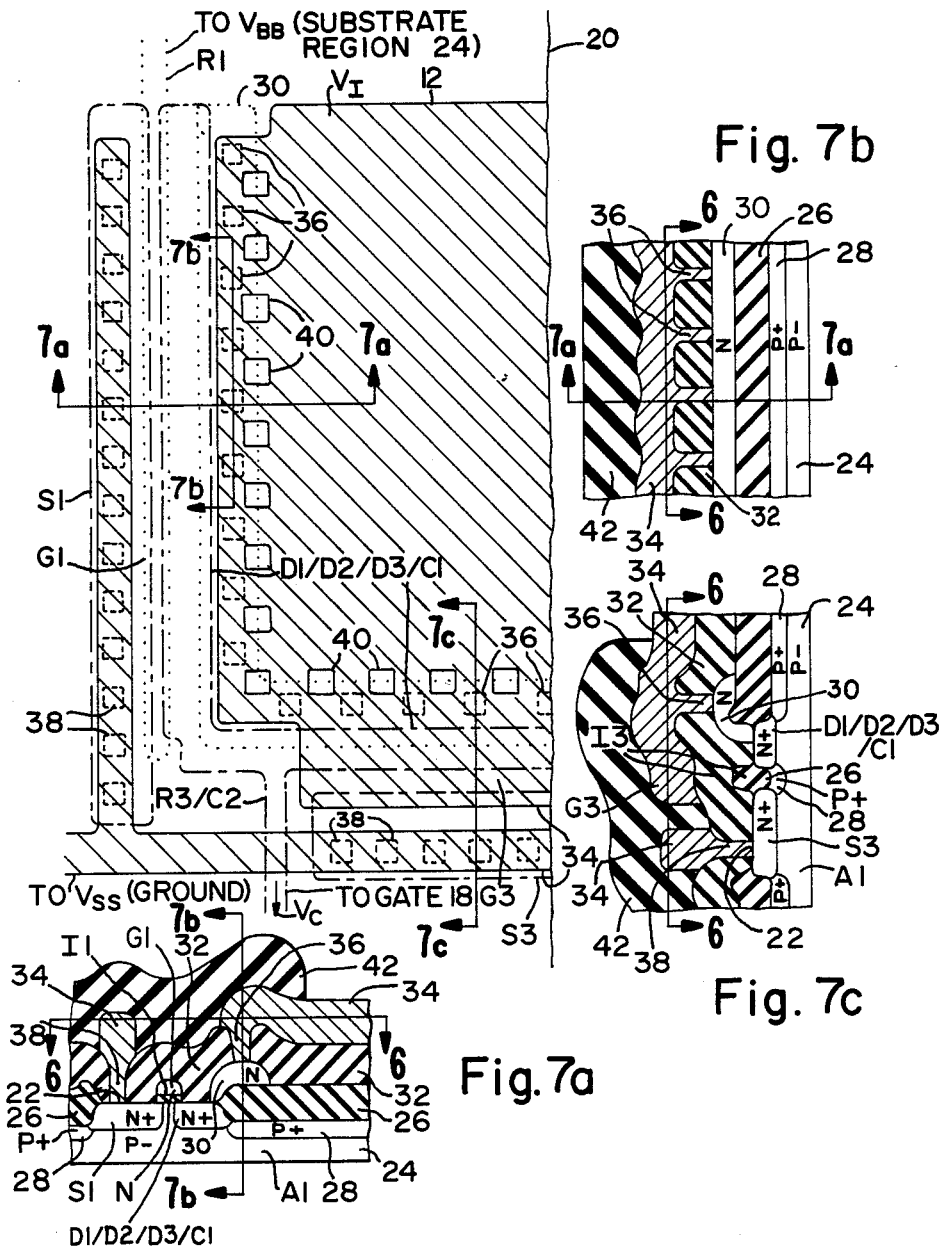

Fig. 8
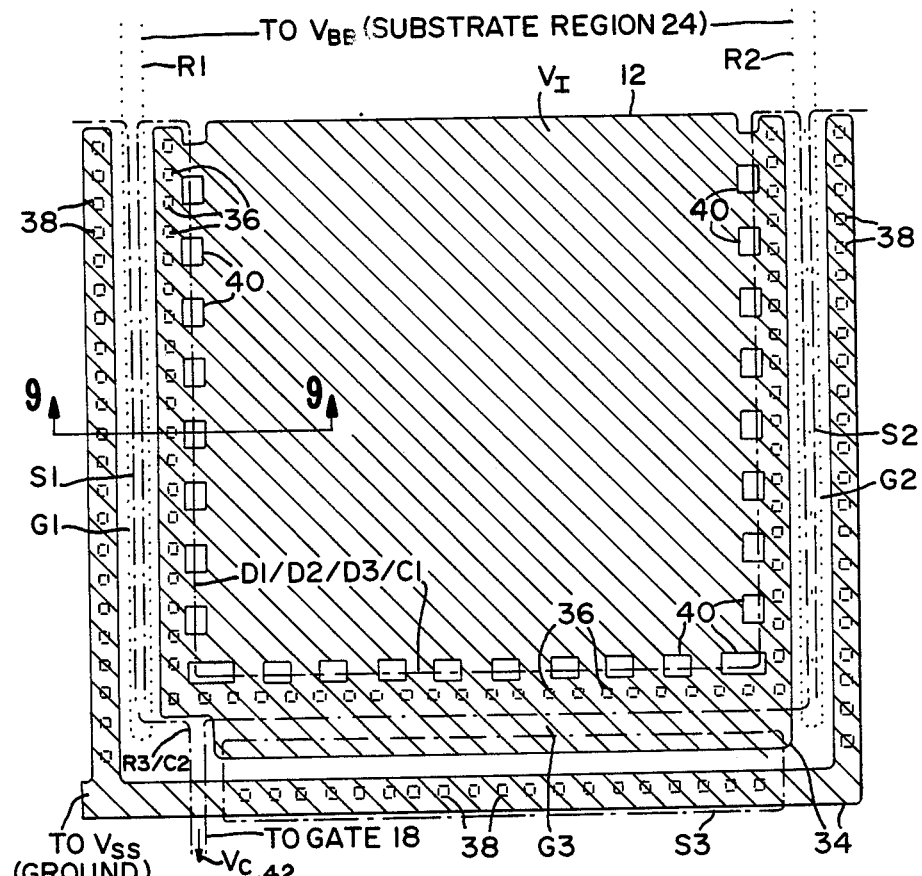
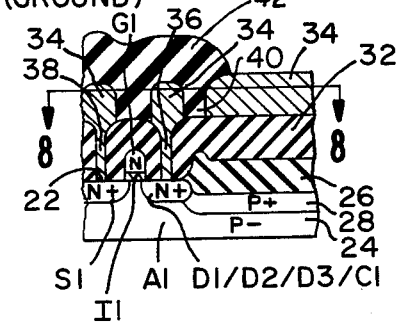
Fig. 9

INPUT PROTECTION DEVICE FOR INTEGRATED CIRCUITS

This is a continuation of U.S. patent application Ser. No. 435,586, filed Oct. 20, 1982, now abandoned.

FIELD OF USE

This invention relates to devices for preventing an input signal applied to a terminal of a semiconductor integrated circuit (IC) from damaging an IC section coupled to the terminal.

BACKGROUND ART

IC's are prone to damage from electrostatic discharge (ESD). This is especially true for metal-oxide semiconductor (MOS) type IC's whose field-effect transistors (FET's) utilize thin gate dielectrics that rupture at moderate voltages. For example, conventional MOS-type gate dielectrics employ about 500–1,000 angstroms of silicon dioxide which ruptures at 6–9 volts/100 angstroms. Thus, 30 volts across a 500-angstrom oxide dielectric could destroy it.

In addition to oxide rupture, ESD currents on the order of an ampere often appear at the IC terminals. If the heat genered by these currents is not properly dissipated, electromigration of the metal in the lead pattern and microdiffusion of dopants in the IC can occur. The result is a short between the IC's substrate region and the lead pattern.

Generally, an MOS-type IC is most susceptible to ESD damage during assembly, test, transfer, and installation when a voltage generated by a person handling the IC discharges across it. A person can easily develop 1,000–10,000 volts. The destructive effect of this high voltage is partially alleviated by the source resistance of the human body. However, the resulting ESD signal can still be very damaging. To prevent dielectric rupture, a protection device for dissipating ESD energy is conventionally connected between each input terminal of an MOS IC and its operative section.

In evaluating such an input protection device, a circuit representing the human body is conventionally employed. FIG. 1 illustrates how such a "human body" circuit interacts with an IC 10 having an input terminal 12 that receives the resulting ESD input signal $V_I$ from the human body. In this circuit, a source voltage $V_S$ representing the actual ESD voltage is applied through a two-pole switch 14 to a grounded capacitor $C_S$ representing the human body capacitance of about 100–200 picofarads. After capacitor $C_S$ is charged to $V_S$, switch 14 is moved from its charging position to its discharging position. Capacitor $C_S$ then discharges through a resistor $R_S$ representing the human body resistance of 1,000–2,000 ohms so as to generate signal $V_I$.

Terminal 12 is connected to an input protection device 16 which operates on signal $V_I$ to produce a modified input signal $V_C$ that is desirably not strong enough to damage a protected gate 18 of IC 10 to which signal $V_C$ is supplied. Insofar as device 16 protects gate 18, resistor $R_S$ is part of the operational dynamics since it modulates the $V_S$ discharge from capacitor $C_S$.

Numerous types of devices have been considered for IC input protection. J. Keller, "Protection of MOS Integrated Circuits from Destruction by Electrostatic Discharge," *Proceedings of the* 1980 *Electrical Overstress-/Electrostatic Discharge Symposium*, pp. 73–80, provides a good summary of various MOS input protection circuits.

FIG. 2 illustrates one of the prior art input protection schemes discussed by Keller for IC 10 when it is an N-channel IC fabricated on a semiconductor substrate having a P-type substrate region which receives a reference voltage $V_{SS}$. In this protection device 16, an N-type diffused resistor RA connected between terminal 12 and gate 18 limits the current flow. Resistor RA does not have a high value, however, because it would unacceptably attenuate signal $V_C$. Even a moderate RA value such as 1,000 ohms which is conventional may unduly attenuate the $V_C$ voltage.

The P-type substrate region forms a PN diode JA with the N-type material of resistor RA. Diode JA is normally reverse biased. Its reverse breakdown voltage $V_{BD}$ is less than the rupture voltage $V_R$ of the thin-oxide gate dielectrics in IC 10. Assuming that $V_{SS}$ is ground, diode JA breaks down by avalanching to provide a path for transmitting the $V_I$ current to the $V_{SS}$ supply when the $V_I$ voltage reaches $V_{BD}$. This is intended to prevent the $V_I$ voltage from rising to $V_R$. However, due to the time needed for breakdown to occur, the $V_I$ voltage may still pass $V_{BD}$ and reach $V_R$ to damage gate 18. Diode JA is typically useful for $V_S$ values up to several hundred volts above which it permanently breaks down. When the $V_I$ voltage drops slightly below ground, diode JA turns on to provide (positive) current from the $V_{SS}$ supply. This prevents voltage $V_I$ from dropping to $-V_{BD}$ and likewise protects gate 18.

An N-channel enhancement-mode thin-oxide insulated-gate FET QA is conventionally employed with elements RA and JA. FET QA is a punch-through FET whose drain is connected between resistor RA and gate 18 and whose insulated gate is connected through a parasitic resistance RB to the QA source which, in turn, is connected to the $V_{SS}$ supply through a parasitic resistance RC. Because they are the inherent resistances of the electrical connections for the QA gate and source, resistances RB and RC are small, typically no more than 25–50 ohms each. When the $V_I$ voltage is positive, FET QA protects gate 18 principally by punch-through as the depletion region of the QA drain extends to the QA source to provide a conductive path to the $V_{SS}$ supply. FET QA also lowers the breakdown voltage of the portion of diode JA near the QA drain. Where the gate dielectrics in IC 10 are about 1,000 angstroms, human body resistor $R_S$ is about 1,500 ohms, and human body capacitor $C_S$ is about 100 picofarads, the combination of FET QA and resistor/diode RA and JA prevents $V_S$ values up to about 1,500 volts from damaging gate 18.

FIG. 3 illustrates another example of device 16 described by Keller for IC 10 when it is an N-channel IC. In FIG. 3, device 16 again contains diffused resistor/diode RA and JA connected and operable as before. A PN diode JB whose anode is the P-type substrate region at $V_{SS}$ and whose cathode is connected to terminal 12 functions in the manner described for diode JA.

The important addition to device 16 in FIG. 3 is an N-channel (enhancement-mode) thick-oxide insulated-gate FET QB whose drain is connected to gate 18. The QB source receives voltage $V_{SS}$ while the QB insulated gate is connected to terminal 12. The gate dielectric of FET QB consists of part of a silicon-dioxide field region that laterally individually surrounds active semiconductor regions containing electronic components of IC 10. This field-oxide gate dielectric is of such a thickness that the threshold voltage $V_T$ of FET QB is less than $V_R$ but greater than the $V_I$ levels reached during normal IC operation. Should the $V_I$ voltage rise above the $V_T$ of FET QB, it turns on so as to provide a path to the $V_{SS}$ supply to inhibit the $V_I$ voltage from rising further. Should the $V_I$ voltage attempt to rise even further, FET QB acts as a punch-through FET in which its drain depletion region extends to its source so as to provide a wider current path to the $V_{SS}$ supply. For the conditions given above for FIG. 2, input protection devices employing thick-oxide FET's such as FET QB can prevent damage at $V_S$ values up to 2,500–3,000 volts.

Under more stringent conditions where, for example, the gate dielectric thickness is 500 angstroms, $R_S$ is 1,000 ohms, and $C_S$ is 200 picofarads, the above devices do not perform as well. It does not appear that they would provide protection at $V_S$ values of 1,500 volts or more. Moreover, most of the ESD energy is dissipated at the front end of resistor RA connected to terminal 12 because FET QA or QB is connected to the back end of resistor RA. This can lead to metal electromigration and dopant microdiffusion near the front end of resistor RA.

DISCLOSURE OF THE INVENTION

In accordance with the invention, an IC protection device for preventing an input signal applied to an IC terminal from damaging a section of the IC coupled to the terminal contains an enhancement-mode insulated-gate FET whose drain is coupled to the terminal. A first voltage is supplied to the source of the FET. Its insulated gate is coupled to one end of a resistor whose other end receives a second voltage.

The IC is formed from a semiconductor body having a primary monocrystalline semiconductive region with which the source and drain each define a PN junction. The FET is usually off during test as well as normal IC operation. Because of the resistor's presence, the FET acts temporarily as a "floating-gate" FET for a short period of time after the input signal changes. During this time period, the voltage at the insulated gate floats at a value dependent on the ratio of the parasitic capacitance of the insulated gate to the drain and the parasitic capacitance of the insulated gate to the source and primary region. The momentary change in the gate voltage is normally around 10–15% of the input voltage change. For a 1-volt threshold voltage, the FET turns on when the input signal rises about 8 volts so as to provide a conductive path for discharging the input signal to the first voltage. As the input signal rises further, the FET turns on harder. This progressively slows further increase in the input voltage. The net effect is to prevent the input voltage from reaching the thin-oxide gate-dielectric rupture voltage.

The drain is desirably coupled to the terminal along semiconductive material of the drain extending to extreme points encompassing most of its width so as to distribute current flowing between the source and drain. This alleviates heat build-up so as to avoid damage that could otherwise occur from dopant microdiffusion and metal electromigration.

The primary region is maintained at the second voltage. If the FET is N-channel, the second voltage is preferably less than the first voltage plus the FET's threshold voltage. Conversely, if the FET is P-channel, the second voltage is preferably greater than the first voltage plus the FET's threshold voltage. Accordingly, the FET is normally off and turns on only when the input signal approaches a voltage that could damage the IC. Where the IC is MOS-type, it can then maintain its high input impedance.

In the preferred structure, a recessed field-oxide region laterally encloses active semiconductor regions of the IC. The device then further includes a thick-oxide FET whose gate dielectric consists at least partly of a part of the field-oxide region. The source and drain of the thick-oxide FET each define a PN junction with the primary region. The source receives the first voltage, while the drain and insulated gate are coupled to the terminal. The thick-oxide FET protects the IC section by the turn-on and punch-through mechanisms generally described above. By having the drains of the FET's integral, they cooperate in preventing damage to the IC section.

Further protection is provided by an input resistor coupled between the terminal and the IC section. Because the other elements of the present input protection device are coupled to the front end of the input resistor, it has to dissipate much less energy than in the prior art. This avoids metal electromigration and dopant microdiffusion in the vicinity of the input resistor. It is preferably about 200 ohms which is much lower than in the prior art and does not significantly attenuate the input voltage.

When the oxide gate-dielectric thickness is about 500 angstroms at 1,000 ohms and 200 picofarads for the human body resistance and capacitance, the present device prevents damage to the IC section at ESD voltages of 2,000 volts or more. This is much better than the above prior art devices could achieve under the same conditions.

BRIEF DESCRIPTION OF THE DRAWINGS

FIG. 6 is a cross-sectional layout view of an embodiment of the structure of the input protection device of FIG. 4 taken through plane 6—6 in FIGS. 7a, 7b, and 7c.

FIGS. 7a, 7b, and 7c are cross-sectional side views of the structure of FIG. 6 taken through planes 7a—7a, 7b—7b, and 7c—7c, respectively.

FIG. 8 is a cross-sectional layout view of another embodiment of the structure of the input protection device of FIG. 4 taken through plane 8—8 in FIG. 9.

FIG. 9 is a cross-sectional side view of the structure of FIG. 8 taken through plane 9—9.

Like reference symbols are employed in the drawings and in the description of the preferred embodiments to represent the same or very similar item or items.

FIGS. 6 and 8 are drawn substantially to scale. The solid lines in FIGS. 6 and 8 represent elements actually appearing at planes 6—6 and 8—8, respectively. The non-solid lines represent elements lying below planes 6—6 and 8—8. In particular, the dotted lines represent polycrystalline silicon (polysilicon) regions. The dot-and-dash lines represent N+ doped monocrystalline silicon regions. The dashed lines represent apertures through dielectric material down to underlying silicon.

DESCRIPTION OF THE PREFERRED EMBODIMENTS

Figure 4:
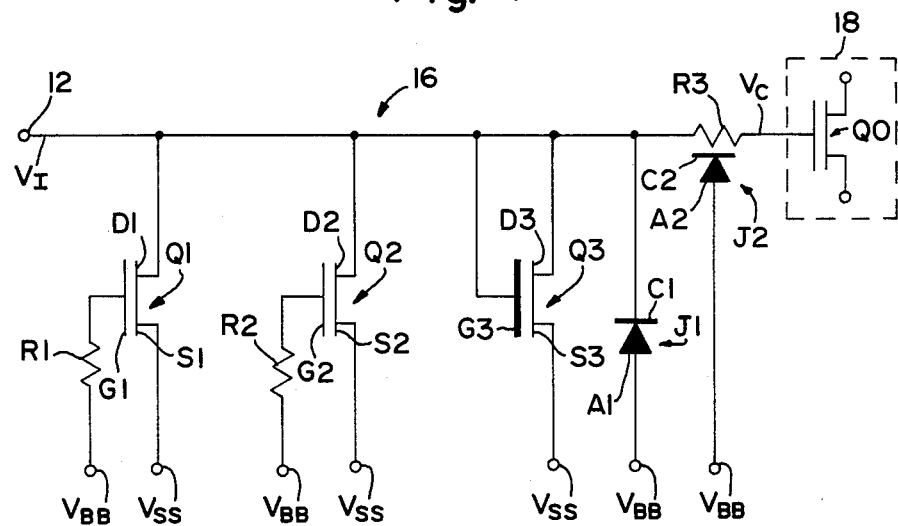
FIG. 4 is a circuit diagram of an input protection device according to the invention for preventing damage to a gate in an N-channel IC.

Referring to the drawings, FIG. 4 illustrates a circuit embodiment of the present input protection device 16 which operates on input signal $V_I$ appearing at terminal 12 in such a manner as to generate signal $V_C$ at voltage levels that do not damage gate 18. Signal $V_C$ is supplied to the insulated gate of a typical FET Q0 in gate 18. Terminal 12, device 16, and gate 18/FET Q0 are part of IC 10 which is an N-channel IC here. The rupture voltage $V_R$ of the silicon-dioxide gate dielectric of FET Q0 is as little as 30 volts.

Device 16 in FIG. 4 contains a pair of N-channel enhancement-mode thin-oxide insulated-gate FET's Q1 and Q2 whose respective drains D1 and D2 are connected to terminal 12. Their sources S1 and S2 each receive reference voltage $V_{SS}$ which is preferably off-chip ground (0 volt) during normal operation with IC 10 powered. Each FET Q1 and Q2 has a threshold voltage $V_{TG}$ of about 1 volt. The insulated gate G1 of FET Q1 is connected to one end of a resistor R1 whose other end receives a back-bias reference voltage $V_{BB}$ which is preferably the substrate voltage. The insulated gate G2 of FET Q2 is similarly connected to one end of a resistor R2 whose other end receives voltage $V_{BB}$. The use of resistors R1 and R2 enables FET's Q1 and Q2 to act temporarily as "floating-gate" FET's when the $V_I$ voltage changes.

During normal IC operation, FET's Q1 and Q2 are preferably off. This means that $V_{BB}$ must be less than $V_{SS} + V_{TG}$ since the voltage at gate G1 or G2 is $V_{BB}$ during normal operation. An on-chip substrate bias generator (not shown) preferably provides voltage $V_{BB}$ at a value several volts below $V_{SS}$. If no substrate bias generator is employed, voltages $V_{BB}$ and $V_{SS}$ are the same.

When IC 10 is not powered, two situations arise. Firstly, while IC 10 is being handled, voltages $V_{SS}$ and $V_{BB}$ float. Because there is no mechanism to cause voltage $V_{BB}$ to rise above $V_{SS}$ by $V_{TG}$ or more, FET's Q1 and Q2 do not go into the conductive (on) state. Secondly, during test, voltage $V_{SS}$ is normally fixed at ground. If voltages $V_{BB}$ and $V_{SS}$ are the same, there is no difference between $V_{BB}$ and $V_{SS}$ to turn on FET's Q1 and Q2. If voltages $V_{BB}$ and $V_{SS}$ are not the same, voltage $V_{BB}$ floats but at a value insufficient in itself to turn on FET's Q1 and Q2. In short, any voltage difference that may exist between voltages $V_{BB}$ and $V_{SS}$ does not itself turn on FET's Q1 and Q2 when IC 10 is unpowered.

When ESD or other phenomena cause the $V_I$ voltage to reach about 8 volts above $V_{SS}$, FET's Q1 and Q2 temporarily turn on to discharge the $V_I$ voltage towards $V_{SS}$ and thereby prevent damage to gate 18/FET Q0. This also protects FET's Q1 and Q2. In discussing the mechanism which causes FET's Q1 and Q2 to turn on, it is assumed for convenience that voltage $V_{SS}$ is ground reference. If voltage $V_{SS}$ is not actually ground, the actual value of $V_{SS}$ must be subtracted from the various voltages. The final result is the same.

Figure 5:
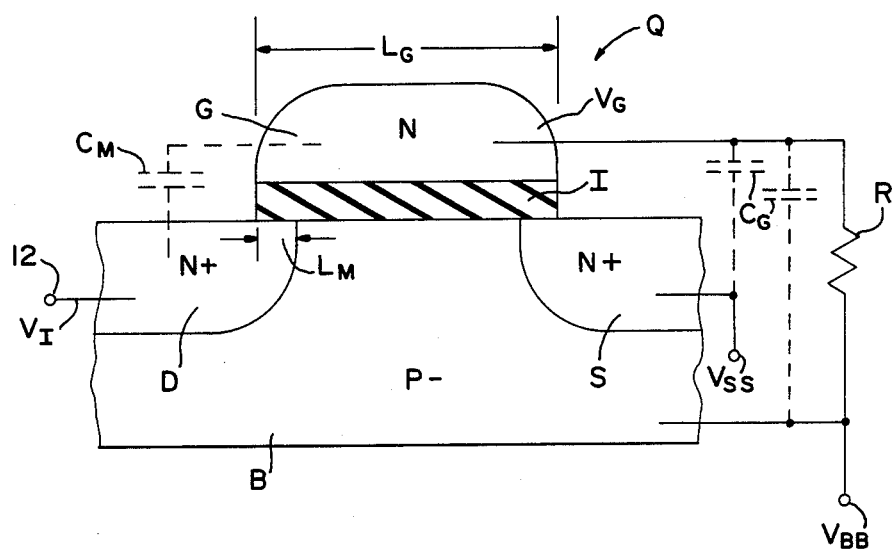
FIG. 5 is a schematic of a "floating gate" FET used in FIG. 4.

Understanding the mechanism which causes FET's Q1 and Q2 to turn on is facilitated with the aid of FIG. 5 which depicts an FET Q representing FET Q1 or Q2. A resistor R representing resistor R1 or R2 is connected between the $V_{BB}$ supply and the gate electrode G of FET Q. Its drain D receives the $V_I$ voltage, and its source S receives voltage $V_{SS}$. Source S and drain D each define a PN junction with a substrate region B which receives voltage $V_{BB}$. Gate dielectric I separates gate G from source S, drain D, and substrate region B.

As indicated in FIG. 5, a parasitic capacitance $C_M$ exists between gate G and drain D. Between gate G, on one hand, and source S and substrate region B, on the other hand, is another parasitic capacitance $C_G$. Capacitances $C_M$ and $C_G$ form a capacitive voltage divider that sets and attempts to hold the voltage $V_G$ of gate G at a value $V_{FG}$ when the $V_I$ voltage changes by an amount $\Delta V_I$. By balancing charges, $V_{FG}$ is $V_{BB} + \Delta V_I/(1 + C_G/C_M)$. That is, $\Delta V_G/\Delta V_I$ equals $1/(1 + C_G/C_M)$ where $\Delta V_G$ is the change in voltage $V_G$. Opposing the effort to hold voltage $V_G$ at $V_{FG}$ is the coupling through resistor R to the $V_{BB}$ supply that provides a path to discharge voltage $V_G$ to $V_{BB}$. Resistor R temporarily prevents gate voltage $V_G$ from discharging to $V_{BB}$ (or, perhaps more accurately, slows down the $V_G$ discharge rate) so as to enable voltage $V_G$ to remain near $V_{FG}$ for a short period of time. Resistor R thus effectively isolates gate G from the $V_{BB}$ supply during this short time period so as to make FET Q temporarily a "floating-gate" FET whose gate voltage $V_G$ depends on the parasitic capacitance ratio $C_G/C_M$.

Transient change $\Delta V_G$ is normally about 10–15% of change $\Delta V_I$. When voltage $V_{FG}$ exceeds threshold level $V_{TG}$, FET Q turns on for a short period of time to provide a path for discharging the $V_I$ voltage. Because of the time needed to transmit the $V_I$ energy through FET Q to the $V_{SS}$ supply, signal $V_I$ does not instantaneously drop to $V_{SS}$. Instead, signal $V_I$ normally rises more. As voltage $V_{FG}$ also rises, FET Q turns on harder. This increases the conductance of FET Q so as to progressively slow down the $V_I$ rise. The result is that FET Q and resistor R prevent the $V_I$ voltage from rising more than about 25 volts above $V_{SS}$. This is less than the 30-volt $V_R$ of FET Q0 and thus protects it.

Eventually, voltage $V_G$ returns to $V_{BB}$. FET Q then acts as a thin-oxide punch-through FET.

The ratio $C_G/C_M$ is determined approximately as follows. As shown in FIG. 5, gate G of FET Q has a length $L_G$ and overlaps drain D by an amount $L_M$. Capacitance $C_M$ is the product of $L_M$ and a proportionality constant (which includes the width of gate G). To a rough approximation, capacitance $C_G$ is the product of $(L_G - L_M)$ and the same proportionality constant. Accordingly, $C_G/C_M$ equals $L_G/L_M - 1$. Therefore, $\Delta V_G/\Delta V_I$ equals $L_M/L_G$. $L_G/L_M$ is normally about 7–10 and is preferably 8, leading to the above $V_I$ level at which FET Q turns on.

Figure 1:
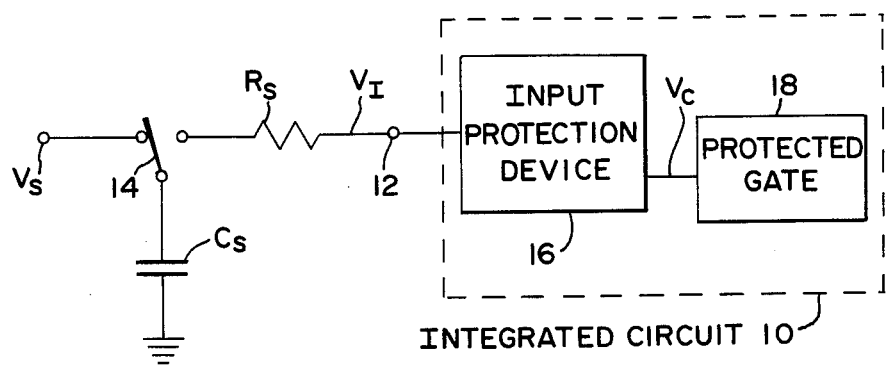
FIG. 1 is a diagram indicating how an IC input protection device interacts with a circuit modeling the human body.
Figure 2:
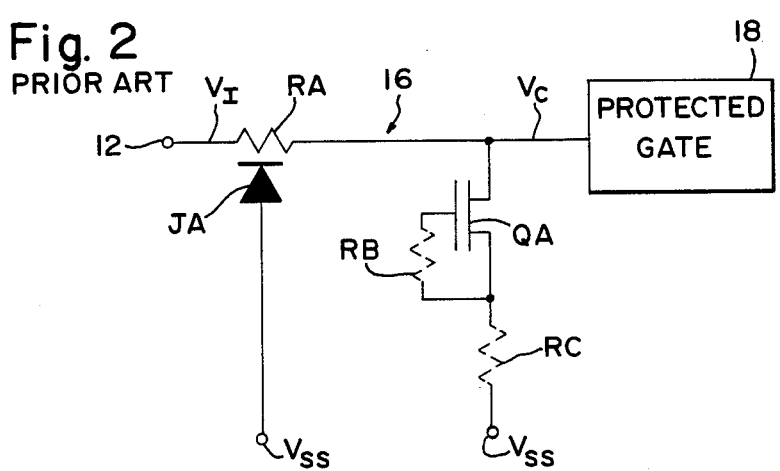
FIGS. 2 and 3 are circuit diagrams of prior art IC input protection devices.
Figure 3:
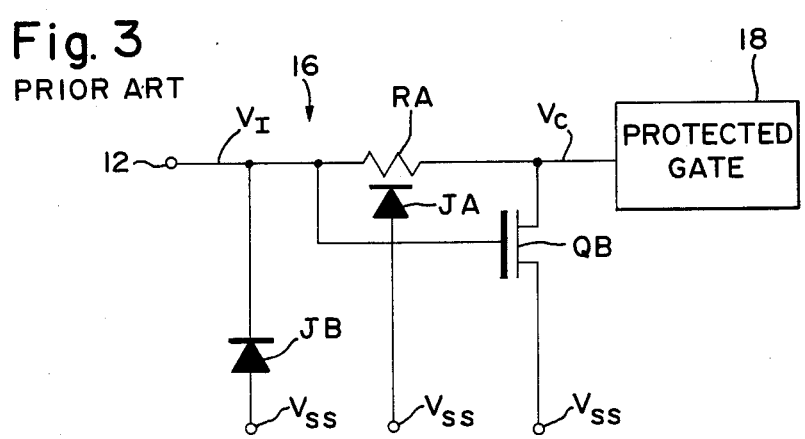

During ESD testing with a circuit such as that of FIG. 1, voltage $V_{SS}$ is set at ground. Voltage $V_{BB}$ floats but at a value near ground. Signal $V_I$ is initially ground. The foregoing $V_{FG}$ relationship then simplifies to $V_{FG}/V_I$ equals $1/(1 + C_G/C_M)$ which equals $L_M/L_G$. Since threshold $V_{TG}$ is about 1 volt, FET Q turns on when the $V_I$ voltage rises to about 8 volts.

Returning to FIG. 4, device 16 contains further elements that cooperate with FET's Q1 and Q2 to protect gate 18. Among these elements is an N-channel enhancement-mode thick-oxide FET Q3 whose drain D3 and insulated gate G3 are connected to terminal 12 to receive signal $V_I$. The source S3 of FET Q3 receives voltage $V_{SS}$. The gate dielectric of FET Q3 principally consists of silicon dioxide having a thickness of 1.2–1.4 microns. The $V_T$ of FET Q3 is about 20 volts. FET Q3 is normally off. Assuming again that voltage $V_{SS}$ is ground, FET Q3 turns on if the $V_I$ voltage reaches the 20-volt $V_T$ of FET Q3. This establishes a path to discharge the $V_I$ voltage to $V_{SS}$ and inhibits further $V_I$ increase.

Another of the protection elements is a PN diode J1 whose cathode C1 is connected to terminal 12 and whose anode A1 receives voltage $V_{BB}$. The reverse breakdown voltage $V_{BD}$ of diode J1 is about 14 volts. Its forward threshold conductive drop $V_F$ is about 0.7 volt.

When voltage $V_I$ is positive and exceeds $V_{BB}$ by at least the 14-volt $V_{BD}$ of diode J1, it breaks down to provide a path for transmitting the $V_I$ current to the $V_{BB}$ supply. On the other hand, when the $V_I$ voltage is negative and drops below $V_{BB}$ by the 0.7-volt $V_F$ of diode J1, it turns on to enable the $V_{BB}$ supply to provide (positive) current to terminal 12. This prevents signal $V_I$ from dropping further.

The final protective element in device 16 is a resistor R3 connected between terminal 12 and gate 18. The purpose of resistor R3 is to momentarily isolate the peak $V_I$ voltage long enough from signal $V_C$ to allow elements Q1, Q2, Q3, and J1 to lower the peak $V_I$ voltage below $V_R$. Inasmuch as resistor R3 is a diffused element, associated with it is a PN diode J2 whose cathode C2 consists of the resistive material of resistor R3 and whose anode A2 receives voltage $V_{BB}$.

FIG. 6 illustrates a cross-sectional layout view of a preferred embodiment of about half of device 16 of FIG. 4. In particular, FIG. 6 shows all of FET Q1, part of resistors R1 and R3, and about half of FET Q3 and diode J1. The remaining unshown half of this layout is substantially symmetrical about center line 20 except for the lower left-hand portion of FIG. 6 where resistor R3 is located. That is, FET Q2 and resistor R2 are configured as mirror images of FET Q1 and resistor R1, and the unshown half of FET Q3 and diode J1 is configured largely as a mirror image of the half shown. FIG. 7a and 7b show cross-sectional side views of the embodiment of FIG. 6 and center on FET Q1. FIG. 7c depicts another cross-sectional side view of the embodiment of FIG. 6 and centers on FET Q3. This embodiment is particularly suitable for MOS-type circuits that use buried contacts.

In this embodiment, the active transistor elements are formed along a surface 22 in a semiconductor body containing a P− monocrystalline silicon semiconductive substrate region 24. The monocrystalline electronic elements lie in active semiconductor regions individually laterally separated from one another by a composite electrically insulating region consisting of a recessed field region 26 of silicon dioxide and an underlying highly doped P+ region 28. Field-oxide region 26 extends about 2,000 angstroms above and below surface 22. P+ region 28 extends about 1.2 microns below oxide region 26.

Drains D1, D2, and D3 and cathode C1 are an integral N+ region D1/D2/D3/C1 that extends about 4,000 angstroms below surface 22 to define a PN junction with P− region 24 which serves as anode A1. Resistor R3 and cathode C2 consist of an N+ region R3/C2 continuous with region D1/D2/D3/C1 and extending to about the same depth below surface 22. P− region 24 also serves as anode A2. Each source S1, S2, or S3 is an N+ region that likewise extends to about the same depth below surface 22 to define a PN junction with P− region 24.

Above surface 22, the gate dielectric I1 for FET Q1 or the (unshown) gate dielectric I2 for FET Q2 is a layer of silicon dioxide having a thickness of about 500 angstroms. Overlying gate G1 or G2 consists of an N-type region of polysilicon. Resistor R1 or R2 is an N-type polysilicon strip continuous with respective gate G1 or G2. Lying over part of region D1/D2/D3/C1 and extending along its entire width (i.e., in a direction perpendicular to the current flow between source S1, S2, or S3 and region D1/D2/D3/C1) and making buried contact with it all along its width is another N-type polysilicon strip 30.

An electrically insulating layer 32 of 8% phosphorus-doped silicon dioxide (Vapox) lies on polysilicon regions G1, R1, G2, R2, and 30 and on portions of oxide region 26 and N+ regions S1, S2, S3 and D1/D2/D3/C1. Vapox layer 32 has a thickness of about 1 micron. As shown in FIG. 7c, the gate dielectric I3 of FET Q3 consists of the portion of oxide region 26 whose lower sidewalls lie between source S3 and region D1/D2/D3/C1 plus the overlying portion of Vapox layer 32.

An electrically conductive pattern 34 of aluminum with about 1% silicon overlies Vapox layer 32 and extends down through apertures 36 in layer 32 to contact polysilicon strip 30. This provides a connection to terminal 12 which consists of the portion of conductive pattern 34 in the middle and upper part of the right half of FIG. 6. Apertures 36 are spaced apart along nearly all of polysilicon strip 30 which makes buried contact with region D1/D2/D3/C1. Accordingly, apertures 36 are spaced apart along nearly the entire widths of the portions of region D1/D2/D3/C1 that actually serve as drains D1, D2, and D3 as well as along nearly all of cathode C1. This distributes the (positive) current flowing from region D1/D2/D3/C1 to sources S1, S2 and S3 and anode A1 so as to prevent current crowding and consequent damage to region D1/D2/D3/C1 itself. Pattern 34, which is about 1 micron thick, also extends down to surface 22 through apertures 38 in layer 32 to contact sources S1, S2, and S3. Apertures 38 are similarly spaced apart along nearly the entire widths of sources S1, S2, and S3 to prevent current crowding.

Near the lateral edge of terminal 12, it has apertures 40 that extend through it down to Vapox layer 32. Apertures 40 are employed for alignment during assembly bonding.

A passivating layer 42 of silicon nitride having a thickness of about 1.5 microns overlies the resulting structure except for portion of terminal 12 that serves as a bonding pad. Although the top of layer 42 does not appear in FIG. 6 so as to indicate the precise location of the bonding pad, its location can be ascertained by referring to FIGS. 7a and 7c.

FIG. 8 illustrates a cross-sectional layout view of an alternative embodiment of device 16 of FIG. 4. FIG. 9 is a cross-sectional side view of a portion of FIG. 8 centering on FET Q1. Inasmuch as the structure of this embodiment is configured largely the same as the structure of the previous embodiment, elements in FIGS. 8 and 9 corresponding to elements in FIGS. 6, 7a, 7b, and 7c are labeled with the same reference symbols. The principal difference between the two embodiments is that polysilicon strip 30 is absent in the alternative embodiment. Instead, the portion of conductive pattern 34 forming terminal 12 directly contacts region D1/D2/D3/C1 by way of apertures 36. They are spaced apart along nearly the entire widths of the portions of region D1/D2/D3/C1 that actually serve as drains D1, D2, and D3 as well as along nearly all of cathode C1. This again distributes current flowing from region D1/D2/D3/C1 to sources S1, S2, and S3 and anode A1 in order to prevent current crowding. The alternative embodiment is specifically suited for use in MOS circuits that do not use buried contacts. FIG. 9 particularly illustrates one of alignment apertures 40 in conductive pattern 34.

In combination with apertures 36 and 38, the width of each FET Q1 or Q2 is at least 25 microns so as to avoid current crowding. The Q1 or Q2 width is preferably about 125 microns in both structural embodiments. Similarly, resistors R1 and R2 are each no less than 100 ohms so as to assure that FET's Q1 and Q2 temporarily act as "floating-gate" FET's. Resistors R1 and R2 are each preferably 300 ohms. FET Q3 has a width of 125 microns in both embodiments. Resistor R3 is about 200 ohms. Diode J1 has an area of about 4,000 micron$^2$. Voltages $V_{BB}$ and $V_{SS}$ are $-3$ volts and 0 volt, respectively, during normal operation.

Methods for manufacturing the various elements of the present invention are well known in the semiconductor art. Conventional masking, etching, and cleaning techniques which are not further referred to in order to simplify the discussion are employed in creating the various doped regions. Except as indicated below, both embodiments of FIG. 4 are manufactured in the following manner.

The starting material is a P− monocrystalline silicon substrate having a resistivity of about 25 ohm-cm. Field-oxide region 26 and P+ region 28 are formed according to conventional techniques, boron being selectively implanted at $2 \times 10^{13}$ ions/cm$^2$ into the field areas of the substrate and then being driven downward to form P+ region 28 as oxide region 26 is formed. This creates the field-oxide portion of gate dielectric I3 with part of P+ region 28 underlying this field-oxide portion.

A 500-angstrom layer of silicon dioxide is thermally grown along the top of the substrate. Boron is then selectively implanted into the channels of the various FET's to set their threshold voltages. The 500-angstrom oxide layer is selectively etched to leave gate dielectrics I1 and I2. A polysilicon layer is deposited on the top of the structure, doped by diffusion with phosphorus to attain a sheet resistance of about 25 ohms/square, and then selectively etched to form regions G1, G2, R1, R2, and 30. In the case of the alternative embodiment (of FIGS. 8 and 9), the portion of the polysilicon layer that would otherwise form region 30 is also etched away. Using gates G1 and G2 in combination with dielectrics I1 and I2 to provide self alignment, arsenic is selectively implanted into the top of the structure and then thermally drivnn in to create N+ regions D1/D2/D3/C1, R3/C2, S1, S2, and S3 at a sheet resistance of about 30 ohms/square.

Vapox layer 32 is deposited on the top of the structure and selecively etched to form apertures 36 and 38. Conductive pattern 34 is formed by depositing an appropriate layer of silicon-aluminum and selectively etching it. The structure is then completed by depositing passivation layer 42 and selectively etching it to expose the bonding pad.

While the invention has been described with reference to particular embodiments, this description is solely for the purpose of illustration and is not to be construed as limiting the scope of the invention claimed below. For example, semiconductor materials of opposite conductivity type to those described above may be employed to accomplish the same results. The back-bias voltage supplied to the insulated gate of each "floating-gate" FET by way of its resistor could conceivably be of such a value as to make it conductive during normal IC operation; in this case, the input signal would likely have to be stronger during normal operation. While two "floating-gate" FET/resistor combinations (in parallel) have been described, a different number could be employed. The present input protection device could be used on bipolar IC's. Thus, various modifications, changes, and applications may be made by those skilled in the art without departing from the true scope and spirit of the invention as defined by the appended claims.

What I claim is:

1. An integrated circuit protection device for preventing an input signal applied to a terminal of an integrated circuit from damaging a section of the circuit coupled to the terminal, the circuit comprising a semiconductor body having an upper surface along which a recessed field-oxide region laterally separates active semiconductor portions of a primary moncrystalline semiconductive region of the body, the device comprising:

an N-channel enhancement-mode first insulated-gate field-effect transistor (FET) having a source that receives a first voltage, an insulated-gate electrode, and a drain coupled to the terminal, the source and drain lying in one of the active portions along the upper surface;

a resistor of which one end is coupled to the insulated-gate electrode of the first FET and the other end receives a second voltage; and an N-channel thick-oxide second insulated-gate FET having a source that lies in one of the active portions along the upper surface and receives the first voltage, an insulated-gate electrode coupled to the terminal, and a drain that lies in another of the active portions along the upper surface and is coupled to the terminal.

2. A device as in claim 1 wherein the drains are directly connected to the terminal.

3. A device as in claim 2 wherein connection of the drains to the terminal is made by contacting (1) semiconductive material of the drains at the upper surface of the primary region and (2) material of the terminal extending along a line running generally parallel to the width of each drain, the extreme points of this material along the line encompassing most of the width of that drain.

4. A device as in claim 3 wherein the foregoing extreme points for each drain encompass nearly all of its width, whereby current flowing between the source and the drain of each FET is distributed across their widths.

5. A device as in claim 3 wherein the connection of each drain to the terminal is made by contacting that drain with a material that is substantially metallic or with doped polycrystalline semiconductor material.

6. A device as in claim 3 wherein the drains lie in the same one of the active portions and are continuous with each other so as to be integral.

7. A device as in claim 3 wherein the first FET has a width of at least 25 microns.

8. A device as in claim 7 wherein the resistor is at least 100 ohms.

9. A device as in claim 3 wherein each of the sources and drains defines a PN junction with the primary region which is maintained at the second voltage.

10. A device as in claim 3 wherein the first and second voltages are substantially the same.

11. A device as in claim 10 wherein each of the first and second voltages is ground reference.

12. A device as in claim 1 wherein an input resistor is coupled between the terminal and the section.

13. A device as in claim 3 wherein the second voltage less than the first voltage plus the threshold voltage of the first FET.

14. An integrated circuit protection device for preventing an input signal applied to a terminal of an integrated circuit from damaging a section of the circuit coupled to the terminal, the circuit comprising a semiconductor body having an upper surface along which a recessed field-oxide region laterally separates active semiconductor portions of a primary monocrystalline semiconductive region of the body, the device comprising:

an enhancement-mode first insulated-gate field-effect transistor (FET) having a source that receives a first voltage, an insulated-gate electrode, and a drain directly connected to the terminal, the source and drain lying in a first of the active portions along the upper surface;

a resistor of which one end is coupled to the insulated-gate electrode of the first FET and the other end receives a second voltage; and a like-polarity thick-oxide second insulated-gate FET having a source that lies in a second of the active portions along the upper surface and receives the first voltage, an insulated-gate electrode coupled to the terminal, and a drain that lies in the first active portion along the upper surface, is directly connected to the terminal, and is continuous with the other drain; where connection of the drains to the terminal is made by contacting (1) semiconductive material of the drains at the upper surface of the primary region and (2) material of the terminal extending along a line running generally parallel to the width of each drain, the extreme points of this material along the line encompassing most of the width of that drain; and where the terminal is largely in the shape of a rectangle as viewed in a direction generally perpendicular to the upper surface of the body, the drain of the first FET lies along one side of the rectangle, and the drain of the second FET lies along another side of the rectangle contiguous with the first-mentioned side.

15. An integrated circuit protection device for preventing an input signal applied to a terminal of an integrated circuit from damaging a section of the circuit coupled to the terminal, the circuit comprising a semiconductor body having an upper surface along which a recessed field-oxide region laterally separates active semiconductor portions of a primary moncrystalline semiconductive region of the body, the device comprising:

an enhancement-mode first insulated-gate field-effect transistor (FET) having a source that receives a first voltage, an insulated-gate electrode, and a drain directly connected to the terminal, the source and drain lying in one of the active portions along the upper surface;

a resistor of which one end is coupled to the insulated-gate electrode of the first FET and the other end receives a second voltage; and a like-polarity thick-oxide second insulated-gate FET having a source that lies in one of the active portions along the upper surface and receives the first voltage, an insulated-gate electrode coupled to the terminal, and a drain that lies in another of the active portions along the upper surface and is directly connected to the terminal; where connection of the drains to the terminal is made by contacting (1) semiconductive material of the drains at the upper surface of the primary region and (2) material of the terminal extending along a line running generally parallel to the width of each drain, the extreme points of this material along the line encompassing most of the width of that drain; and where the second voltage is less than the first voltage during the operation of the circuit where the first FET is an N-channel FET, and the second voltage is greater than the first voltage during operation of the circuit where the first FET is a P-channel FET.

16. A device as in claim 13 wherein the second voltage is less than the first voltage during the operation of the circuit.

* * * * *